(12) United States Patent
Mao et al.

(10) Patent No.: US 7,183,037 B2
(45) Date of Patent: Feb. 27, 2007

(54) ANTIREFLECTIVE COATINGS WITH INCREASED ETCH RATES

(75) Inventors: Zhibiao Mao, Sunnyvale, CA (US); Suzanne Coley, Mansfield, MA (US); Timothy G. Adams, Sudbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 849 days.

(21) Appl. No.: 09/932,792

(22) Filed: Aug. 17, 2001

(65) Prior Publication Data

US 2002/0028408 A1   Mar. 7, 2002

Related U.S. Application Data

(60) Provisional application No. 60/226,110, filed on Aug. 17, 2000.

(51) Int. Cl.
*G03C 1/76* (2006.01)

(52) U.S. Cl. ..................... 430/271.1; 430/325
(58) Field of Classification Search .............. 430/270.1, 430/325, 271.1
See application file for complete search history.

(56) References Cited

U.S. PATENT DOCUMENTS

| | | | |
|---|---|---|---|
| 5,677,112 A | 10/1997 | Urano et al. | |
| 5,830,624 A | 11/1998 | Bae et al. | |
| 5,935,760 A | 8/1999 | Shao et al. | |
| 6,087,068 A | 7/2000 | Sato et al. | |
| 6,261,743 B1 | 7/2001 | Pavelchek et al. | |
| 6,297,170 B1 * | 10/2001 | Gabriel et al. | 438/738 |
| 6,316,165 B1 | 11/2001 | Pavelchek et al. | |
| 6,329,118 B1 | 12/2001 | Hussein et al. | |
| 6,368,400 B1 | 4/2002 | Baldwin et al. | |
| 6,368,768 B1 | 4/2002 | Jung et al. | |
| 6,410,209 B1 | 6/2002 | Adams et al. | |
| 6,451,503 B1 | 9/2002 | Thackeray et al. | |
| 6,472,128 B2 | 10/2002 | Thackeray et al. | |
| 2002/0031729 A1 | 3/2002 | Trefonas et al. | |
| 2002/0055000 A1 | 5/2002 | Kennedy et al. | |

OTHER PUBLICATIONS

J.D. Meador et al., "Second–generation 193 nm Bottom Antireflective Coatings" (BARCs); Proceedings of the SPIE—The International Society for Optical Engineering; vol. 3999, No. 2, Mar. 1, 2000, pp. 1009–1018, XP002192314, USA, p. 1010; Figure 1.

* cited by examiner

*Primary Examiner*—Rosemary Ashton
(74) *Attorney, Agent, or Firm*—Peter F. Corless; Darryl P. Frickey; Edwards & Angell, LLP

(57) ABSTRACT

The present invention provides new light absorbing compositions suitable for use as an antireflective coating ("ARC") with an overcoated resist layer. ARCs of the invention exhibit increased etch rates in standard plasma etchants. Preferred ARCs of invention have significantly increased oxygen content relative to prior compositions.

42 Claims, No Drawings

ANTIREFLECTIVE COATINGS WITH INCREASED ETCH RATES

This application claims the benefit of Provisional Application No. 60/226,110, filed Aug. 17, 2000.

BACKGROUND OF THE INVENTION

1. Field of the Invention

The present invention relates to compositions that reduce reflection of exposing radiation from a substrate back into an overcoated photoresist layer. More particularly, the invention relates to antireflective coating compositions ("ARCs") that exhibit increased etch rates in standard plasma etchants. Preferred ARCs of the invention have significantly increased oxygen content relative to prior compositions.

2. Background

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are known to the art and described by Deforest, Photoresist Materials and Processes, McGraw Hill Book Company, New York, ch. 2, 1975 and by Moreay, Semiconductor Lithography, Principles, Practices and Materials, Plenum Press, New York, ch. 2 and 4, both incorporated herein by reference for their teaching of photoresist compositions and methods of making and using the same.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the more important steps in attaining high resolution photoresist images.

Reflection of activating radiation used to expose a photoresist often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect". To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical. For example, metal interconnects used on many microelectronic substrates are particularly problematic due to their topography and regions of high reflectivity.

With recent trends towards high-density semiconductor devices, there is a movement in the industry to shorten the wavelength of exposure sources to deep ultraviolet (DUV) light (300 nm or less in wavelength), KrF excimer laser light (248.4 nm), ArF excimer laser light (193 nm), electron beams and soft x-rays. The use of shortened wavelengths of light for imaging a photoresist coating has generally resulted in increased reflection from the upper resist surface as well as the surface of the underlying substrate. Thus, the use of the shorter wavelengths has exacerbated the problems of reflection from a substrate surface.

In efforts to reduce the problem of reflected radiation, certain radiation absorbing layers have been interposed between the substrate surface and the photoresist coating layer. See, for example, PCT Application WO 90/03598, EPO Application No. 0 639 941 A1 and U.S. Pat. Nos. 4,910,122, 4,370,405 and 4,362,809, all incorporated herein by reference for their teaching of antireflective (antihalation) compositions and the use of the same. Such layers have also been referred to in the literature as antireflective layers or ARCs (antireflective compositions).

In Shipley Company's European Application 542 008 A1, highly useful antihalation (antireflective) compositions are disclosed that comprise a resin binder and a crosslinker compound. Additional highly useful ARCs are disclosed in U.S. Pat. Nos. 5,939,236 and 5,886,102, both assigned to the Shipley Company.

While it has been found that prior ARC compositions may be effective for many antireflective applications, those prior compositions also may pose some potential performance limitations.

In particular, ARC etch rates can be problematic. During plasma etching of an underlying ARC layer to thereby bare a substrate (e.g. microelectronic wafer) surface, the plasma etch also will remove the overlying developed photoresist mask. An effective thickness of the resist mask must remain after the ARC is complete to function during processing of the bared substrate surface. However, as the time period required to remove the ARC layer increases, the extent of degradation of photoresist mask also increases. This is highly undesirable.

Photoresist degradation should be minimized to permit application of a thin a photoresist layer as possible. Thinner resist layers are often desired to provide maximum resolution of a patterned image. If UFTL is significant during ARC etching, then a thicker resist layer must be applied so that a resist mask of an effective thickness remains at the end of the etching process.

It thus would be desirable to have new antireflective coating compositions for use with an overcoated photoresist layer. It would be particularly desirable to have new antireflective coating compositions that would minimize photoresist degradation by means of a faster etch rate.

SUMMARY OF THE INVENTION

We have discovered new antireflective coatings ("ARCs") which exhibit increased etch rates in standard plasma etchants. In fact, ARCs of the invention demonstrate such enhanced etch rates that resist degradation is significantly minimized during etching.

ARCs of the invention typically have significantly increased oxygen content relative to prior ARC compositions. Preferred ARCs of the invention comprise at least about 5 to at least about 50 mole percent oxygen. Particularly preferred ARCs of the invention comprise at least about 30 mole percent oxygen, still more preferably about 40 mole percent oxygen, still more preferably about 50 mole percent, most preferably about 60 mole percent. Such an increased oxygen content can be achieved by a variety of ways.

In a first preferred aspect of the invention, the oxygen content of the antireflective composition may be increased by addition of a high oxygen content additive. Such an additive preferably comprises at least about 30 or 40 mole percent oxygen based on the total additive composition, more preferably at least about 50 mole percent oxygen, still more preferably at least about 60 mole percent oxygen, based on the total of the additive composition.

Additives for use in ARCs of the invention preferably comprise one or more small molecules, e.g., compounds having a molecular weight of less than about 3,000 daltons are particularly preferred. Preferred high oxygen content additives include oligomeric compounds.

Rather than or in addition to employing a separate high oxygen content additive, ARC resin and/or crosslinker components may be adapted to provide a high oxygen content composition.

For example, ARCs of the invention typically contain a chromophore that absorbs exposure radiation. Preferably, such chromophores are bound covalently to a resin component of the ARC.

Thus, in this second aspect of the invention, that chromophore may be adapted to have a high oxygen content. In that way, the oxygen content of the antireflective composition can be increased by virtue of a particular monomer or polymer employed as the resin. For instance, for ARCs of the invention that are used with resists imaged at 193 nm, a preferred chromophore is phenyl. For ARCs of the invention that are used with resists imaged at 248 nm, a preferred chromophore is anthracene. Other suitable chromophores, especially for 248 nm imaging, include quinolinyl, and ring-substituted quinolinyl derivatives such as hydroxyquinolinyl groups. Such phenyl, anthracene and other aromatic chromophores can have one or more high oxygen content substituents, such as an ester linkage, particularly a high oxygen content ester such as acetoxy (i.e. —OC(=O) CH$_3$. Some specifically preferred high oxygen content chromophores that can be polymerized to provide a ARC resin of the invention include of acetoxystyrene, 2-hydroxy-3-phenoxymethacrylate, 2-phenoxyethylmethacrylate; hydroxy anthracene; acetoxyanthracene; and the like.

An ARC resin may be adapted to have a high oxygen content separate from modification of the chromophore groups. For example, resins for use in ARCs of the invention may be produced by polymerization of one or more high oxygen content monomers. Preferred ARC resins of the invention contain polymerized acrylate ester units, wherein the linked ester moiety (i.e. group linked to carboxyl oxygen of ester) contains one or more oxygen atoms.

Particularly preferred compounds for incorporation into resins of ARCs of the invention include compounds of the following formula:

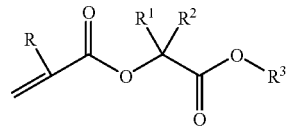

wherein R is hydrogen or alkyl having 1 to about 8 carbons, and preferably R is hydrogen or methyl; and R$^1$, R$^2$ and R$^3$ are each independently optionally substituted alkyl preferably having from 1 to about 10 carbon atoms, more preferably 1 to about 3 or 4 carbon atoms; or optionally substituted alkoxy having 1 to about 10 carbon atoms, more preferably 1 to about 3 or 4 carbon atoms. Particularly preferred R$^1$, R$^2$ and R$^3$ groups have one or two carbon atoms, i.e. optionally substituted methyl, ethyl, methoxy and ethoxy. Preferred substituents of substituted R$^1$, R$^2$ and R$^3$ groups are oxygen-containing moieties, e.g. hydroxyl; lower alkoxy; esters; alkanoyl and the like.

ARCs of the invention preferably comprise a crosslinker. In that way, the antireflective coating layer can avoid intermixing of resist and ARC layers and, in at least some systems, crosslink with an overcoated layer of a photoresist composition, thereby increasing adhesion between the two coating layers. The crosslinker preferably can be thermally activated. The crosslinker can be comprised of a variety of materials, and preferably is an amine based material, such as a glycouril resin.

ARCs of the invention also preferably comprise an acid or thermal acid generator to catalyze the reaction between the resin binder and the crosslinking compound, enabling the crosslinking reaction to proceed at relatively lower temperatures. As used herein, the term "acid generator" refers to a compound that generates an acid upon appropriate treatment of the compound, for example, upon exposure to activating radiation or thermal treatment.

ARCs of the invention provide an improved etch rate differential over prior ARCs. (As referred to herein, the term "ARC etch rate differential" means the rate at which an underlying ARC layer will be etched by a plasma etchant relative to the rate an overcoated resist layer will be etched by the same etchant). For example, ARCs of the invention etch in a standard F$_2$/O$_2$ plasma at a rate of about at least 25% greater than conventional photoresist compositions. More preferably, ARCs of the invention etch at a rate of about at least 40%, most preferably at least about 50% or 60% greater than an overcoated photoresist compositions in such plasma.

As referred to herein the term a "standard plasma etch" is defined to mean a plasma etch conducted by the following protocol: a coated substrate (e.g., substrate coated with an ARC and/or resist in accordance with the invention) is placed in a plasma etch chamber (e.g., Mark II Oxide Etch Chamber) at 25 mT pressure, top power of 600 watts, 33 $CHF_3$ (Sccm), 7 $O_2$ (Sccm) and 80 Ar (Sccm). Typically the organic layer(s) (i.e., ARC and/or resist) will have a dried (soft-bake) thickness of 1000 Å per layer.

The invention further provides methods for forming a relief image and novel substrates coated with an ARC of the invention and a photoresist composition. Typical substrates coated with ARC and resists in accordance with the invention include microelectronic wafers, flat panel displays and optical-electronic substrates.

Other aspects of the invention are disclosed infra.

DETAILED DESCRIPTION OF THE INVENTION

As noted above, the present invention provides new antireflective coatings which exhibit increased etch rates in standard plasma. In fact, ARCs of the invention demonstrate such enhanced etch rates that UFTL and other forms of resist degradation are significantly minimized.

ARCs of the invention typically have significantly increased oxygen content relative to prior ARC compositions. Preferred ARCs of the invention comprise at least about 5 to at least about 50 mole percent oxygen. Particularly preferred ARCs of the invention comprise at least about 30 mole percent oxygen, still more preferably about 40 mole percent oxygen, still more preferably about 50 mole percent, most preferably about 60 mole percent oxygen. Such an increased oxygen content can be achieved by a variety of ways.

In a first preferred aspect of the invention, the oxygen content of the antireflective composition may be increased by addition of a high oxygen content additive. Such an additive preferably comprises at least about 40 mole percent oxygen, more preferably at least about 50 mole percent oxygen, still more preferably at least about 60 mole percent oxygen.

Additives for use in ARCs of the invention preferably comprise one or more small molecules, e.g., compounds having a molecular weight of less than about 3,000 daltons. Such additives may be polymeric or non-polymeric. In a preferred embodiment, the additive is an oligomer suitably having a molecular weight of from about 200 to 2,500 daltons.

ARCs of the invention typically contain a chromophore that absorbs exposure radiation. The chromophore is preferably covalently bound to a resin component of the ARC composition. The chromophore may be adapted to have a high oxygen content. In that way, the oxygen content of the antireflective composition is increased by virtue of a particular monomer or polymer employed as the resin.

Preferably, ARC resins of the invention contain polymerized acrylate ester units, wherein the ester moiety linked to the carboxyl oxygen contains one or more oxygen atoms. For purposes of illustration, the ester moiety linked to the carboxyl oxygen of an ester moiety is the group R of the following formulae wherein the carboxyl oxygen is underlined: —C(=O)OR.

As discussed above, particularly preferred compounds for incorporation into ARC resins of the invention are monomers of the following formula:

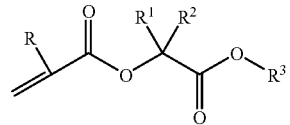

wherein R is hydrogen or alkyl having 1 to about 8 carbons, and preferably R is hydrogen or methyl; and $R^1$, $R^2$ and $R^3$ are each independently optionally substituted alkyl preferably having from 1 to about 10 carbon atoms, more preferably 1 to about 3 or 4 carbon atoms; or optionally substituted alkoxy having 1 to about 10 carbon atoms, more preferably 1 to about 3 or 4 carbon atoms. Particularly preferred $R^1$, $R^2$ and $R^3$ groups have one or two carbon atoms, i.e. optionally substituted methyl, ethyl, methoxy and ethoxy. Preferred substituents of substituted $R^1$, $R^2$ and $R^3$ groups are oxygen-containing moieties, e.g. hydroxyl; lower alkoxy such as $C_{1-4}$alkoxy i.e. methoxy, ethoxy, propoxy, butoxy; lower alkyl esters such as —C(=O) $OC_{1-4}H_{3-9}$; and alkanoyl such as acetyl (—C(=O) $CH_3$) or aldehyde (C(=O)H). Other suitable substituents of substituted $R^1$, $R^2$ and $R^3$ groups include halo (F, Cl, Br, I), $C_{1-4}$ alkyl, $C_{2-4}$ alkenyl and the like.

Additional specifically preferred monomers to include in high oxygen content polymers or other additives of the invention include the following: for ARCs used with resists imaged at 248 nm, preferred monomers include e.g. ethylene glycol methyl ether methacrylate (EGMA), diethylene glycol-methylether methacrylate (DEGMA), and 2,3-dihydroxypropylmethacrylate (DHPMA), which preferably will be polymerized with one or more monomers that contain an anthracene moiety; and for ARCs used with resists imaged at 193 nm, preferred monomers include e.g. 3-methoxy-4-acetoxystyrene, 4-nitrostyrene, 3-nitrostyrene, 4-nitrophenylmethacrylate, and the like.

Preferred resins of ARCs of the invention also are capable of reaction with the crosslinker component, e.g. by a hydroxy or carboxy moiety on the resin or a "masked" moiety such as an ester that can generate such a reactive group in the presence of acid or otherwise.

Preferred resins of antireflective composition resin binder of the invention include copolymers that can be provided by polymerizing two or more different monomers where at least one of the monomers includes a chromophore group.

As noted above, ARCs of the invention preferably further comprise a crosslinker that provide for crosslinking of the resin component. The crosslinker suitably can be thermally activated, i.e. a layer of the antireflective composition can be crosslinked upon thermal treatment of the ARC layer. Such crosslinking can provide a number of advantages, including reducing undesired intermixing of resist and ARC layers, and providing enhanced adhesion through crosslinking between the ARC and resist layers.

The crosslinker can be comprised of a variety of materials, and preferably is an amine based material, such as a glycouril resin, particularly methoxy methylated glycouril resin. Preferably, the crosslinker component is of a relatively high oxygen content.

The preferred methoxy methylated glycouril can be prepared by known procedures. The compound is also commercially available under the tradename of Powderlink 1174 from the American Cyanamid Co.

Other suitable low basicity crosslinkers include hydroxy compounds, particularly polyfunctional compounds such as phenyl or other aromatics having two or more hydroxy or hydroxy alkyl substituents such as a $C_{1-8}$ hydroxyalkyl substituents. Phenol compounds are generally preferred such as di-methanolphenol ($C_6H_3(CH_2OH)_2OH$) and other compounds having adjacent (within 1–2 ring atoms) hydroxy and hydroxyalkyl substitution, particularly phenyl or other aromatic compounds having one or more methanol or other hydroxyalkyl ring substituent and at least one hydroxy group adjacent such hydroxyalkyl substituent. Such crosslinkers also have relatively high oxygen content, thereby further enhancing the ARC oxygen content.

ARCs of the invention also preferably comprise an acid or thermal acid generator to catalyze or otherwise promote the reaction between the resin binder and the crosslinking compound, enabling the crosslinking reaction to proceed at relatively lower temperatures.

A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Typically, a thermal acid generator is present in an antireflective composition in concentration of from about 0.5 to 15 percent by weight of the total of the dry components of the composition, more preferably about 2 percent by weight of the total dry components.

Also, rather than a thermal acid generator, an acid may be simply formulated into the antireflective composition, particularly for antireflective compositions that require heating to cure in the presence of acid so that the acid does not promote undesired reaction of composition components prior to use of the antireflective composition. Suitable acids include e.g. strong acids such as sulfonic acids such as toluene sulfonic acid and sulfonic acid, triflic acid, or mixtures of those materials.

The present invention also includes antireflective compositions that do not undergo significant cross-linking during intended use with a photoresist composition. Such non-crosslinking antireflective compositions need not include a crosslinker component or an acid or thermal acid generator for inducing or promoting a crosslinking reaction. In other words, such non-crosslinking antireflective compositions typically will be essentially free (i.e. less than about 1 or 2 weight percent) or completely free of a crosslinker component and/or acid source for promoting a crosslinking reaction.

Antireflective compositions of the invention may also comprise one or more photoacid generators (i.e. "PAG") that are suitably employed in an amount sufficient to inhibit or substantially prevent undesired notching or footing of an overcoated photoresist layer. In this aspect of the invention, the photoacid generator is not used as an acid source for promoting a crosslinking reaction, and thus preferably the photoacid generator is not substantially activated during crosslinking of the antireflective composition (in the case of a crosslinking ARC). In particular, with respect to antireflective compositions that are thermally crosslinked, the antireflective composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes.

For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$alkyl or $C_{2-15}$alkenyl having one or preferably two or more fluoro substituents.

Antireflective compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 available from the 3M Company.

To make a liquid coating composition, the components of the antireflective composition are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antireflective composition varies from about 0.5 to 20 weight percent of the total weight of the antireflective composition, preferably the solids content varies from about 2 to 10 weight percent of the total weight of the antireflective composition.

A variety of photoresist compositions can be employed with the antireflective compositions of the invention, including positive-acting and negative-acting photoacid-generating compositions. Photoresists of the invention typically comprise a resin binder and a photoactive component, typically a photoacid generator compound. Preferably, the photoresist resin binder has functional groups that impart alkaline aqueous developability to the images resist composition. Preferred are resin binders that comprise polar functional groups such as hydroxyl or carboxylate and the resin binder is used in a resist composition in an amount sufficient to render the resist developable with an aqueous alkaline solution.

Generally preferred resist resin binders are phenolic resins including phenol aldehyde condensates known in the art as novolak resins, homo and copolymers or alkenyl phenols and homo and copolymers of N-hydroxyphenyl-maleimides.

Examples of suitable phenols for condensation with a aldehyde, especially formaldehyde, for the formation of novolak resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight (Mw) from about 500 to 100,000 daltons. Poly(vinylphenols) may be prepared, e.g., as disclosed in U.S. Pat. No. 4,439,516. Preferred resin binders and the preparation thereof are also disclosed in U.S. Pat. No. 5,128,230.

Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols also may be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight (Mw) range of from about 2,000 to about 60,000 daltons.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Further preferred resin binders include resins formed from bishydroxymethylated compounds, and block novolak resins. See U.S. Pat. Nos. 5,130,410 and 5,128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

One suitable class of photoresists for use with ARCs of the invention are "conventional" positive-acting resists that comprise a photoacid generator and a resin binder component such as a novolak or poly(vinylphenol) or partially hydrogenated derivative thereof and wherein the photoactive component serves as a dissolution rate inhibitor. Photoactivation of a coating layer of the resist results in conversion of the photoactive component to an acidic material, rendering regions of the coating layer containing this acidic photoproduct comparatively more soluble in an aqueous alkaline developer solution than regions that contain only the intact (non-activated) photoactive component. The photoactive component typically used in these positive resists are quinone diazides such as 2,1,4-diazonaphthoquinone sulfonic acid esters and 2,1,5-diazonaphthoquinone sulfonic acid esters.

In particularly preferred aspects of the invention, ARCs of the invention are used with chemically amplified positive-acting resist compositions. A number of such resist compositions have been described, e.g., in U.S. Pat. Nos. 4,968,581; 4,883,740; 4,810,613 and 4,491,628, all of which are incorporated herein by reference for their teaching of making and using chemically amplified positive-acting resists.

A particularly preferred chemically amplified photoresist for use with an ARC of the invention comprises in admixture a photoacid generator and a resin binder that comprises a copolymer containing both phenolic and non-phenolic units. For example, one preferred group of such copolymers has acid labile groups substantially, essentially or completely, only on non-phenolic units of the copolymer. One especially preferred copolymer binder has repeating units x and y of the following formula:

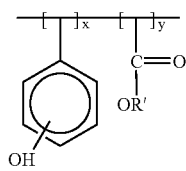

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photo acid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less.

Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less. Additional preferred chemically-amplified positive resists are disclosed in U.S. Pat. No 5,258,257 to Sinta et al.

Preferred negative-acting resist compositions for use with an ARC of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172 and Powderlink 1174, urea-based resins are sold under the trade names of Beetle 60, 65 and 80, and benzoguanamine resins are sold under the trade names Cymel 1123 and 1125.

Suitable photoacid generator compounds of resists used with ARCs of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. 5,128,232 to Thackeray et al. and sulfonate photoacid generators including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

As mentioned above, ARCs of the invention are particularly useful with photoresists that generate a strong acid photoproduct upon exposure such as a triflic acid, camphor sulfonate or other sulfonic acid, or other acid having a pKa (25° C.) of about 2 or less. Without wishing to be bound by theory, it is believed ARCs of the invention are particularly effective with such strong acid resists because the strong photogenerated acid will migrate from the resist and remain in the ARC layer to a lesser extent relative to a comparable ARC that contains a more basic crosslinker. That is, the low basicity crosslinkers of the invention will tie up strong photogenerated acids of an overcoated resist layer to a lesser extent than a more basic ARC crosslinker. As a result thereof, less acid loss from the resist layer will occur and resolution problems such as footing will be reduced.

Photoresists for use with an ARC of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

In practice, an antireflective composition of the invention is applied as a coating layer to a substrate may any of a variety of methods such as spin coating. The antireflective composition, in general, is applied on a substrate with a dried layer thickness of between about 0.02 and 0.5 μm, preferably a dried layer thickness of between about 0.04 and 0.20 μm. The substrate is suitably any substrate conventionally used in processes involving photoresists. For example, the substrate can be silicon, silicon dioxide or aluminum-aluminum oxide microelectronic wafers. Gallium arsenide, ceramic. quartz or copper substrates may also be employed. Substrates used for liquid crystal display or other flat panel display applications are also suitably employed, for example glass substrates, indium tin oxide coated substrates and the like.

Preferably the antireflective layer is cured before a photoresist composition is applied over the ARC. Cure conditions will vary with the components of the ARC. Thus, if the composition does not contain an acid or acid generator, cure temperatures and conditions will be more vigorous than those of a composition containing an acid or acid generator compound. Typical cure conditions are from about 120° C. to 225° C. for about 0.5 to 40 minutes. Cure conditions preferably render the ARC coating layer substantially insoluble to the photoresist solvent as well as an alkaline aqueous developer solution. Additionally, as discussed above, if the ARC includes a photoacid generator, the composition coating layer can be at least partially cured by exposing the coating layer to an effective amount of activating radiation (e.g., between about 10 to 300 mJ/cm$^2$), followed by a post-exposure bake of from 50 to 225° C.

After such curing a photoresist is applied over the surface of the ARC. As with application of the ARC, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the ARC layer and photoresist layer should occur.

The resist layer is then imaged with activating radiation through a mask in conventional manner, e.g., at 193 nm or 248 nm. The exposure energy is sufficient to effectively activate the photoactive component of the resist system to produce a patterned image in the resist coating layer, more specifically, the exposure energy typically ranges from about 3 to 300 mJ/cm$^2$ depending upon the exposure tool. The exposed resist layer may be subjected to a post-exposure bake if desired to create or enhance solubility differences between exposed and unexposed regions of a coating layer. For example, negative acid hardening photoresists typically require post-exposure heating to induce the acid promoted crosslinking reaction, and many chemically amplified positive acting resists require post exposure heating to induce an acid promoted deprotection reaction. Typically post-exposure bake conditions include temperatures of about 50° C. or greater, more specifically a temperature in the range of from about 50° C. to 160° C.

The exposed resist coating layer is then developed, preferably with an aqueous based developer such as an inorganic alkali exemplified by tetrabutyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100 to 150° C. for several minutes to further cure the developed exposed coating layer areas.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. As detailed above, the plasma gas etch will remove the antireflective at an enhanced rate relative to prior compositions.

All documents mentioned herein are incorporated herein by reference. The following non-limiting examples are illustrative of the invention.

EXAMPLE 1

Synthesis of Methyl Methacryloyloxyacetate

A 1L round bottom flask equipped with a magnetic bar and an addition funnel was cooled in an ice/water bath. To the flask were added 90.39 g (1.05 mol) of methacrylic acid and 106.25 g (1.05 mol) of triethylamine in sequence. The resulting colorless solution was warmed to room temperature and was treated with an acetone (250 mL) solution of methyl chloroacetate (108.52 g, 1 mol). White salts formed after 15 min. of mixing. The white suspension was stirred and heated at 45° C. for 12 h. After the suspension was cooled to room temperature, the white salts were filtered off and the acetone solution was concentrated under reduced pressure, yielding a tan solution, which was diluted in 400 mL of hexane. The hexane solution was washed with 200 mL of saturated $Na_2CO_3$ solution and DI water (2×200 mL), then dried over anhydrous $MgSO_4$ and concentrated under reduced pressure. Vacuum distillation (56° C./0.5 mm Hg) of the resulting tan solution resulted in 114 g (72% yield) of the colorless liquid of methyl methacryloyloxyacetate, which was identified and judged pure by $^1$H NMR.

EXAMPLE 2

A polymer is prepared by reaction of methyl methacryloyloxyacetate and methylanthracenemethacrylate monomers. A 300 mL round bottom flask equipped with a magnetic stirrer, nitrogen and vacuum inlet is charged with methyl methacryloyloxyacetate (molar excess) and methylanthracenemethacrylate monomers, AIBN initiator and solvent (THF). The reaction solution is stirred until reaction completion, suitably at elevated temperatures.

EXAMPLE 3

An antireflective composition of the invention is prepared by admixing the components, with component amounts expressed as parts by weight based on total weight of the liquid antireflective coating composition:

1) Resin: polymer of Example 2:2.17%;
2) Crosslinker: 0.61% Powderlink 1174 (American Cyanamid);
3) Acid: 0.06% p-toluene sulfonic acid;
4) Photoacid generator: 0.16% of di-tert-butyl phenyl iodonium camphorsulfonate;
5) Surfactant: 0.03% FC 171 (3M Co.);
6) Solvent: 18% ethyl lactate; 10% cyclohexanaone; and 68.97% propylene glycol monomethyl ether.

The antireflective composition is spin coated onto a silicon wafer substrate and is baked on a vacuum hotplate at 1750° C. for 60 seconds. Over this antireflective composition DUV photoresist (such as sold under the tradename UVIIHS and available from the Shipley Company) is applied by spin coating and the coated substrate is baked at 135° C. for 60 seconds. The overcoated resist layer is then exposed to KrF excimer radiation (248 nm) through a photomask. The coated substrate is then baked on a vacuum hotplate and the resist layer developed with an alkaline aqueous developer.

The foregoing description of the invention is merely illustrative thereof, and it is understood that variations and modifications can be effected without departing from the scope or spirit of the invention as set forth in the following claims.

What is claimed is:

1. A coated substrate comprising:
   a substrate having thereon
      1) a coating layer of an antireflective composition, and
      2) a coating layer of a photoresist over the antireflective layer;
   wherein the antireflective composition comprises at least about 30 mole percent oxygen.

2. The coated substrate of claim 1 wherein the antireflective composition comprises at least about 40 mole percent oxygen.

3. The coated substrate of claim 1 wherein the antireflective composition comprises at least about 50 mole percent oxygen.

4. The coated substrate of claim 1 wherein the antireflective composition comprises at least about 60 mole percent oxygen.

5. The coated substrate of any one of claims 1 through 4 wherein the antireflective composition comprises a) a resin, b) an acid or thermal acid generator, and c) a crosslinker.

6. The coated substrate of claim 1 wherein the antireflective composition further comprises an oxygen-containing additive.

7. The coated substrate of claim 6 wherein the additive has a molecular weight less than about 3,000 daltons.

8. The coated substrate of claim 6 wherein the additive is comprised of about 40 mole percent oxygen.

9. The coated substrate of claim 6 wherein the additive is an oligomer.

10. The coated substrate of claim 1 wherein the antireflective coating composition comprises a resins that contains polymerized acrylate ester units, the ester moiety containing one or more oxygen atoms.

11. The coated substrate of claim 10 wherein the resin contains polymerized units of a monomer of the following formula:

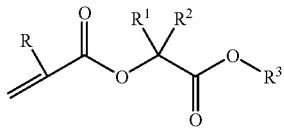

wherein R is hydrogen or alkyl; and $R^1$, $R^2$ and $R^3$ are each independently optionally substituted alkyl or optionally substituted alkoxy.

12. The coated substrate of claim 1 wherein the antireflective coating composition comprises a resin that has one or more chromophores, the chromophore substituted with one or more oxygen atoms.

13. The coated substrate of claim 12 wherein the chromophore is phenyl.

14. The coated substrate of claim 13 wherein the phenyl is substituted by an ester moiety.

15. The coated substrate of claim 12 wherein the chromophore comprises a monomer selected from the group consisting of acetoxystyrene, 2-hydroxy-3-phenoxymethacrylate, and 2-phenoxymethylmethacrylate.

16. The coated substrate of claim 1 wherein the the substrate is a microelectronic wafer, a flat panel display substrate or an optical-electronic substrate.

17. The substrate of claim 1 wherein the antireflective composition comprises a resin with phenyl groups.

18. The substrate of claim 1 wherein the antireflective composition comprises a resin with anthracene groups.

19. A method for forming a photoresist relief image on a substrate comprising:
   (a) applying on a substrate a layer of an antireflective composition,
   (b) applying a layer of a photoresist composition over the antireflective composition layer, and
   (c) exposing the photoresist layer to activating radiation and developing the exposed photoresist layer;
   wherein the antireflective composition comprises at least about 30 mole percent oxygen.

20. The method of claim 19 wherein the antireflective composition comprises at least about 40 mole percent oxygen.

21. The method of claim 19 wherein the antireflective composition further comprises an oxygen-containing additive.

22. The method of claim 21 wherein the additive is comprised of about 40 mole percent oxygen.

23. The method of claim 19 wherein the antireflective coating composition comprises a resin that contains polymerized acrylate ester units, the ester moiety containing one or more oxygen atoms.

24. The method of claim 23 wherein the resin contains polymerized units of a monomer of the following formula:

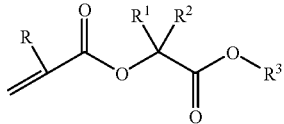

wherein R is hydrogen or alkyl; and $R^1$, $R^2$ and $R^3$ are each independently optionally substituted alkyl or optionally substituted alkoxy.

25. The coated substrate of claim 19 wherein the antireflective coating composition comprises a resin that has one or more chromophores, the chromophore substituted with one or more oxygen atoms.

26. The method of claim 25 wherein the chromophore is phenyl.

27. A method for forming a photoresist relief image on a substrate comprising:
   (a) applying on a substrate a layer of an antireflective composition,
   (b) applying a layer of a photoresist composition over the antireflective composition layer, the antireflective composition comprising a resin, an acid or thermal acid generator, and a crosslinker, and
   (c) exposing the photoresist layer to activating radiation and developing the exposed photoresist layer;
   wherein the antireflective composition has an etch rate of at least about 25% greater than the photoresist composition in a standard plasma etch.

28. The method of claim 27 wherein the antireflective composition has an etch rate of up to about 60% greater than the photoresist composition in a standard plasma etch.

29. The method of claim 27 wherein the photoresist layer is exposed to radiation having a wavelength of about 193 nm.

30. The method of claim 27 wherein the photoresist layer is exposed to radiation having a wavelength of about 248 nm.

31. An antireflective coating composition for use with an overcoated photoresist composition, wherein the antireflective composition comprises at least about 40 mole percent of oxygen and a resin that has one or more chromophores, one or more of the chromophores substituted with one or more oxygen atoms.

32. The antireflective coating composition of claim 31 wherein the antireflective composition further comprises an oxygen-containing additive.

33. The antireflective coating composition of claim 32 wherein the additive has a molecular weight less than about 3,000 daltons.

34. The antireflective coating composition of claim 32 wherein the additive is comprised of about 40 mole percent oxygen.

35. The antireflective coating composition of claim 31 wherein the antireflective coating composition comprises a resin that contains polymerized acrylate ester units, the ester moiety containing one or more oxygen atoms.

36. The antireflective coating composition of claim 35 wherein the resin contains polymerized units of a monomer of the following formula:

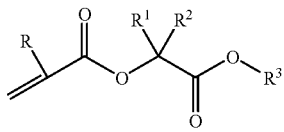

wherein R is hydrogen or alkyl; and $R^1$, $R^2$ and $R^3$ are each independently optionally substituted alkyl or optionally substituted alkoxy.

37. The antireflective coating composition of claim 31 wherein a chromophore of the resin is phenyl.

38. The antireflective coating composition of claim 31 wherein a chromophore of the resin is anthracene.

39. An antireflective coating composition for use with an overcoated photoresist composition, comprising a) a resin, b) an acid or thermal acid generator compound, and c) a crosslinker,
   wherein the antireflective composition comprises at least about 40 percent of oxygen.

40. The antireflective coating composition of claim 39 wherein the antireflective composition comprises a resin that contains polymerized acrylate ester units.

41. The antireflective coating composition of claim 39 wherein the antireflective composition comprises a resin with anthracene groups.

42. The antireflective coating composition of claim 39 wherein the antireflective composition comprises a resin with phenyl groups.

* * * * *